(12) United States Patent
Uran et al.

(10) Patent No.: US 12,712,559 B2
(45) Date of Patent: Aug. 18, 2026

(54) DYNAMIC VOLTAGE SCALING FOR ASYNCHRONOUS ANALOG TO DIGITAL CONVERTERS

(71) Applicant: Kandou Labs SA, Saint-Sulpice (CH)

(72) Inventors: Arda Uran, Lausanne (CH); Christoph Walter, Lausanne (CH); Armin Tajalli, Lausanne (CH)

(73) Assignee: Kandou Labs SA, Saint-Sulpice (CH)

( * ) Notice: Subject to any disclaimer, the term of this patent is extended or adjusted under 35 U.S.C. 154(b) by 118 days.

(21) Appl. No.: 18/925,507

(22) Filed: Oct. 24, 2024

(65) Prior Publication Data

US 2025/0132767 A1 Apr. 24, 2025

Related U.S. Application Data

(60) Provisional application No. 63/592,737, filed on Oct. 24, 2023.

(51) Int. Cl.
*H03M 1/06* (2006.01)
*H03M 1/50* (2006.01)

(52) U.S. Cl.
CPC ......... *H03M 1/0687* (2013.01); *H03M 1/502* (2013.01)

(58) Field of Classification Search
CPC .......... H03M 1/06; H03M 1/50; H03M 1/125; H03M 1/502; H03M 1/0687
See application file for complete search history.

(56) References Cited

U.S. PATENT DOCUMENTS 5,982,314 A * 11/1999 Amar ...................... G06F 7/527 708/625
7,091,894 B2 * 8/2006 Fudge ................ H03M 1/0626 341/120
7,233,270 B2 * 6/2007 Lin .................... H03M 1/0624 341/118
7,301,486 B2 * 11/2007 Wang ................ H03M 1/1004 341/118
7,482,966 B2 * 1/2009 Lee .................... H03M 1/0678 341/172
7,629,905 B2 * 12/2009 Dyer ........................ G06F 1/10 341/118
8,749,419 B2 * 6/2014 Moldsvor .......... H03M 1/0656 341/122
9,312,840 B2 * 4/2016 Dong ................. H03M 1/0626
9,748,967 B1 * 8/2017 Serebryanskiy .... H03M 1/1255
9,871,529 B1 * 1/2018 Chong ................. H03M 1/121
(Continued)

*Primary Examiner* — Lam T Mai

(57) ABSTRACT

Methods and systems are described for converting, using a first asynchronous ADC, an analog input signal to a digital output signal according to a first clock cycle, and outputting a done signal upon completion of the conversion, the first asynchronous ADC configured with a supply voltage large enough that the done signal is asserted prior to a next clock cycle with predetermined probability, generating, using a timing margin sensor comprising a programmable delay unit, a delayed done signal having a reduced timing margin, and measuring, using a dynamic voltage scaling controller, an error rate of the delayed done signal according to the next clock cycle, and adjusting the supply voltage provided to the first asynchronous ADC responsive to the measured error rate deviating from a target error rate by a predetermined threshold.

20 Claims, 9 Drawing Sheets

(56) References Cited

U.S. PATENT DOCUMENTS 10,033,395 B1 * 7/2018 Vaz .................... H03M 1/001
10,944,414 B1 * 3/2021 Vaz .................... H03M 1/0673
11,133,812 B1 * 9/2021 Lebedev ................ H03M 1/40
11,239,852 B2 * 2/2022 Pu .................... H03M 1/0836
11,876,524 B2 * 1/2024 Bolatkale ............... H03M 3/46
2006/0114144 A1 * 6/2006 Lyden ................ H03M 1/0641 341/161
2008/0024346 A1 * 1/2008 Kok .................... H03M 1/125 341/155
2008/0024347 A1 * 1/2008 Choe .................. H03M 1/1215 341/155
2008/0136699 A1 * 6/2008 Lee .................... H03M 1/0678 341/161
2008/0204296 A1 * 8/2008 Prodic .................. H03M 1/502 341/155
2009/0002210 A1 * 1/2009 Dyer .................... H04L 47/521 341/118
2010/0052967 A1 * 3/2010 Currivan .............. H03M 1/188 341/155
2010/0060496 A1 * 3/2010 Madisetti ............ H03M 1/0624 341/118
2011/0102220 A1 * 5/2011 Nam .................. H03M 1/0836 341/122
2013/0002467 A1 * 1/2013 Wang ................... H03M 1/145 341/172
2013/0069812 A1 * 3/2013 Waltari .............. H03M 1/0626 341/166
2014/0152478 A1 * 6/2014 Lewis ................ H03M 1/0673 341/123
2015/0042501 A1 * 2/2015 Shibata .............. H03M 1/1245 341/161
2015/0138006 A1 * 5/2015 Straeussnigg ......... H03M 1/164 341/155
2015/0303934 A1 * 10/2015 Chiu ...................... H03M 1/36 341/120
2015/0341044 A1 * 11/2015 Nakamura .......... H03M 1/0624 341/118
2016/0149582 A1 * 5/2016 Ragab .................. H03M 1/121 341/120
2017/0250699 A1 * 8/2017 Fuchs .................. H03M 1/466
2018/0026648 A1 * 1/2018 Kris ........................ H03K 5/24 341/155
2019/0158103 A1 * 5/2019 Sundström .......... H03M 1/0675
2022/0224347 A1 * 7/2022 Manganaro ........... H03M 1/002
2023/0155598 A1 * 5/2023 Lok .................... H03M 1/1014 341/120
2023/0327680 A1 * 10/2023 Xu ....................... H03M 1/468
2024/0007120 A1 * 1/2024 Terao ................. H03M 1/1245

* cited by examiner

DYNAMIC VOLTAGE SCALING FOR ASYNCHRONOUS ANALOG TO DIGITAL CONVERTERS

CROSS-REFERENCE TO RELATED APPLICATION

This application claims the benefit of U.S. Provisional Patent Application 63/592,737, filed Oct. 24, 2024, naming Arda Uran, Christoph Walter, and Armin Tajalli, entitled "Dynamic Voltage Scaling for Asynchronous Analog to Digital Converters" which is herein incorporated by reference in its entirety for all purposes.

FIELD

Embodiments disclosed herein relate to communications in general and in particular to transmission of signals capable of conveying information via a communication link.

BACKGROUND

Embodiments disclosed herein include systems and methods for data communications, including but not limited to data communications between electronic components and/or electronic devices via one or more communication links in a manner that is fast and reliable while making efficient use of resources.

One common type of communications link is a serial communications link, which may be implemented with (i) a single wire circuit relative to ground or other common reference, or (ii) multiple such circuits relative to ground or other common reference.

One type of serial communication method uses singled-ended signaling (SES). SES operates by sending a signal on one wire and measuring the signal relative to a fixed reference at the receiver. Serial communication methods may also be implemented with several wires in relation to each other. One such type of serial communication method uses differential signaling. Differential signaling operates by sending a signal on one wire and sending the opposite of that signal on a matching wire. The signal information is represented by the difference between the wires rather than their absolute values relative to ground or other fixed reference.

One type of differential signaling relevant to the systems and methods disclosed herein is Pulse Amplitude Modulation (PAM). In PAM, data is encoded in the amplitude of a series of signal pulses. In operation, amplitudes of a train of signals are varied according to the value of the data to be conveyed. PAM signals are demodulated by detecting the amplitude level of the carrier at each signaling period.

One type of PAM signaling is two-level, Non-Return-to-Zero (NRZ) PAM, sometimes referred to as PAM-2 NRZ signaling. In PAM-2 NRZ, data is encoded into two different amplitude levels, such as 0 and +1. In operation a PAM-2 receiver uses one threshold to detect received signals. Any sample above the threshold is a "+1," and any sample below the threshold is a "0."

Another type of PAM is three-level, NRZ PAM, sometimes referred to as PAM-3 NRZ signaling. In PAM-3 NRZ, data is encoded into three different amplitude levels, such as −1, 0, and +1. In operation, a PAM-3 receiver uses high and low reference voltage levels to detect received signals. Any sample above the high reference voltage level is a "+1," any sample below the low reference voltage level is a "−1," and any sample between the high and low reference voltage levels is a "0." Signaling with three values in this manner is sometimes referred to ternary signaling with individual signals during a sample period referred to as a ternary sample. Each ternary symbol may be converted e.g., to a two-bit binary value.

There are many ways to detect information on such serial links. Previously, analog-based receivers have been sufficient in detecting PAM-2 based signaling systems for standards such as PCIe and USB. Emerging standards plan to shift from PAM-2 based signaling systems to PAM-3, PAM-4, etc. Specifically, USB4v2 plans to use PAM-3 signaling and PCIe Gen 7 plans to use PAM-4 signaling. It is expected for receivers to shift to analog-to-digital converter (ADC)-digital signal processing (DSP)-based technologies. ADC-DSP based receivers are open-loop and, support many equalization taps (feed forward equalization and decision feedback equalization), and offer large design flexibility. ADCs are employed to convert analog signals to digital signals, i.e., converting analog voltages received on wires to multiple bits of a digital signal that represent the analog voltage. Successive Approximation Register (SAR) ADCs are one type of ADC. SAR ADCs receive an analog voltage and make a sequence of comparisons of the input voltage to a series of reference voltages according to a binary search to converge on a digital output representative of the analog voltage. For an N-bit SAR ADC, N sequential comparisons are made. Loop-unrolled (LU) SAR ADCs are category of SAR ADCs that employ a multitude of comparators to reduce the latency of ADC by reducing the conversion time of the ADC.

Additional objects and/or advantages of the disclosed embodiments will be apparent to persons of ordinary skill in the art upon review of the Detailed Description and Figures.

BRIEF SUMMARY

Methods and systems are described for receiving, at an asynchronous ADC, an analog input signal and to convert the analog input signal to a digital output signal, the conversion initiated according to a first clock cycle and wherein a done signal is output upon completion of the conversion, the ADC configured with a supply voltage high enough that the done signal is asserted prior to a next clock cycle with a predetermined probability, generating a delayed done signal having a reduced timing margin, measuring an error rate of the delayed done signal according to the next clock cycle, and adjusting the supply voltage provided to the asynchronous ADC responsive to the measured error rate deviating from a target error rate by a predetermined threshold.

BRIEF DESCRIPTION OF THE DRAWINGS

Various embodiments in accordance with aspects of the present disclosure will be described with reference to the drawings, in which.

DETAILED DESCRIPTION

Figure 1:
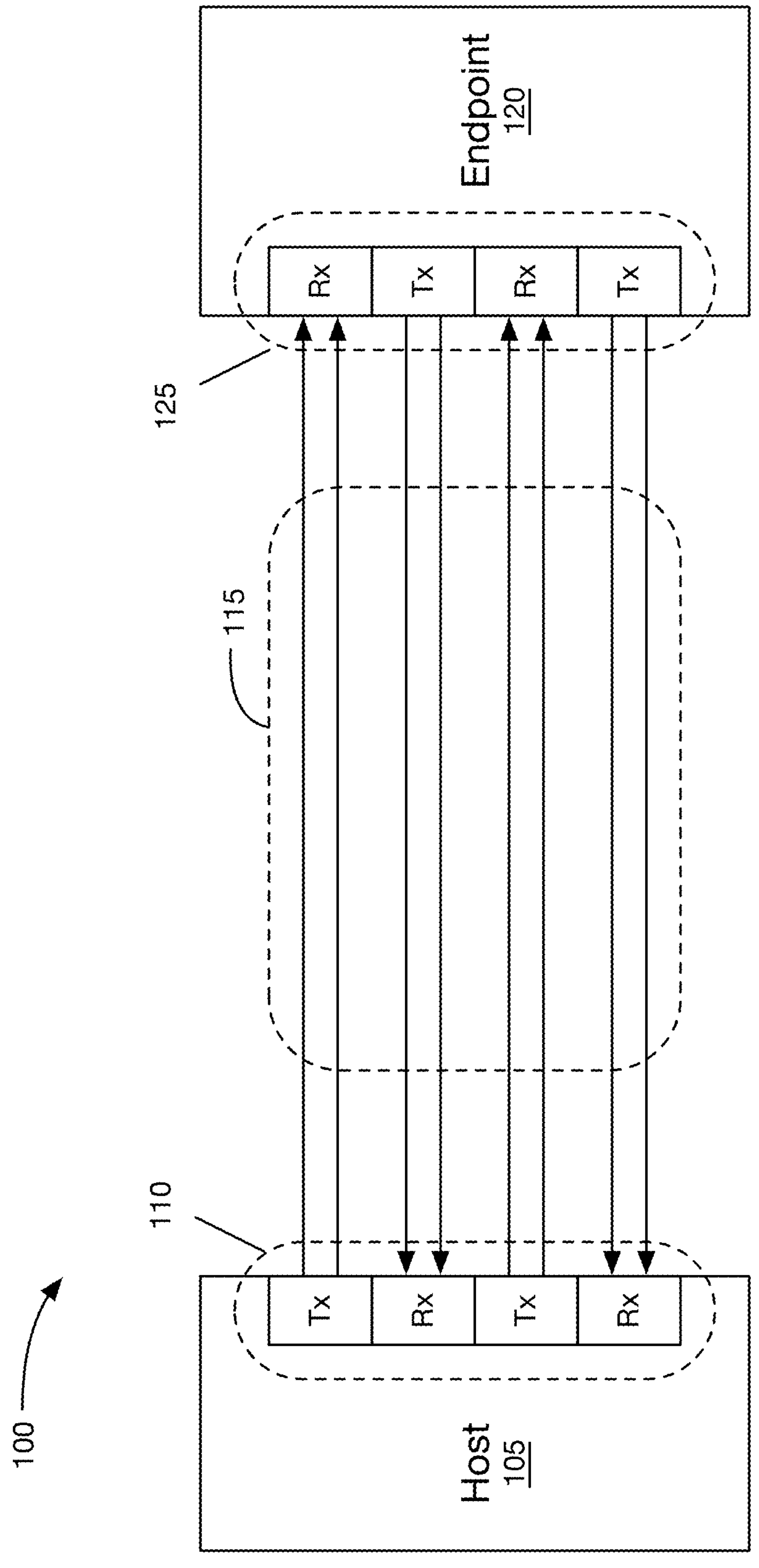
FIG. 1 is a block diagram of a communications system, in accordance with some embodiments.

FIG. 1 is a block diagram of a communications system 100. As shown, communications system 100 includes a host 105 connected to an endpoint via a multi-wire communications channel 115. As shown, host 105 and endpoint 120 each include transceivers 110 and 125, respectively. The multi-wire communications channel 115 includes two bidirectional data lanes. In some embodiments, the bidirectional data lanes are serial data lanes associated with e.g., a Universal Serial Bus (USB) link, a peripheral component interface express (PCIe) link, or other protocols that utilize serial transmission of data. The host 105 may be e.g., a central processing unit (CPU) on a motherboard. The endpoint 120 may be a memory device, a network interface controller (NIC), an artificial intelligence (AI) engine, a graphics processing unit (GPU), a data processing unit (DPU), encryption device, or other hardware for communicating with host 105 via a serial communication network. The multi-wire communications channel 115 may correspond to traces on a printed circuit board (PCB). Alternatively, multi-wire communications channel 115 may be a cable comprising twisted pairs.

Increasing the throughput of a communications protocol may be performed via several methods, including but not limited to (i) increasing the data symbol rate, (ii) increasing the number of data lanes in the communications channel, and (iii) increasing the number of available signaling levels transmitted on the bus, often referred to as Pulse Amplitude Modulation (PAM-X) signaling. As previously described, USB 4v2 and PCIe Generation 7 are adapting to larger throughput demands by shifting to PAM-3 and PAM-4 signaling, respectively. In such environments, ADC-DSP-based receivers are desirable.

Figure 2:
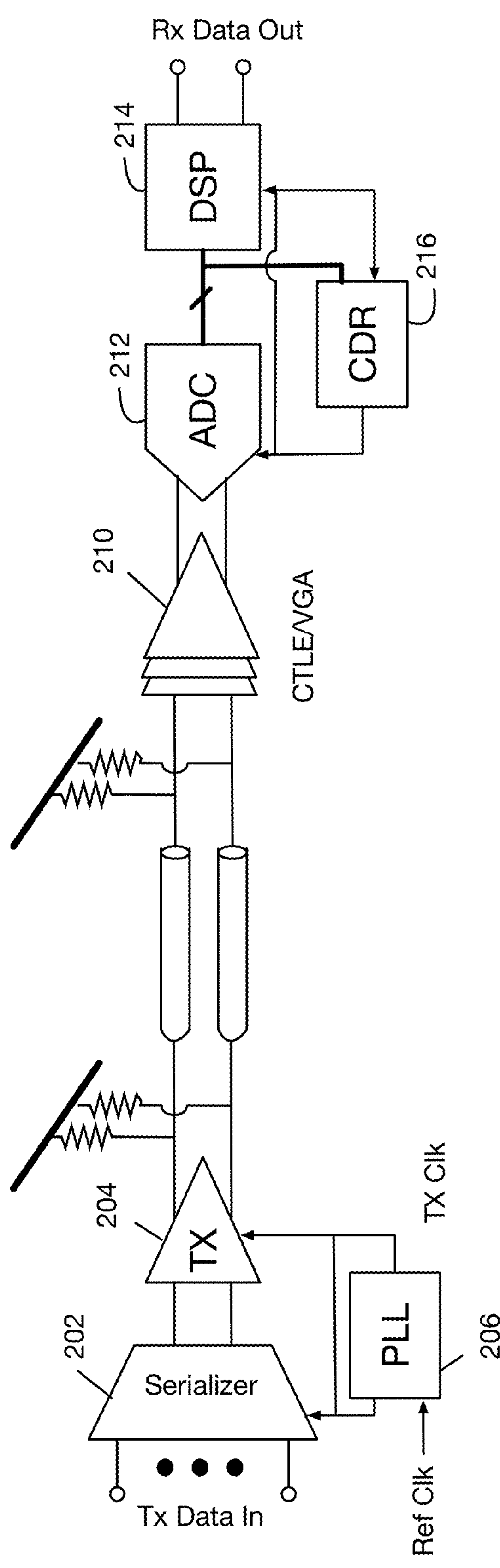
FIG. 2 is a block diagram of a data lane that includes a ADC-DSP based receiver, in accordance with some embodiments.

FIG. 2 is a block diagram of a data lane, e.g., one of the links of FIG. 1. As shown, the data lane includes an ADC-DSP-based receiver. The data lane shown in FIG. 2 may be part of a PCIe data link, a USB link, or other various signaling protocols. As shown, the data lane includes a transmitter at a first end of the channel having a serializer 202 configured to receive parallel data and to output serialized data to a transmit driver 204. The transmitter further includes a phase-locked loop (PLL) 206 configured to generate a transmit clock from a reference clock. A receiver is connected at the other end of the channel, and includes a continuous time linear equalizer (CTLE) and variable gain amplifier (VGA) stage 210 configured to equalize and amplify an input signal and to provide the equalized/amplified input signal as an analog input signal to ADC 212. The ADC 212 is configured to convert the analog input signal to a digital output signal. The receiver further includes a digital signal processor (DSP) 214 configured to apply e.g., feed forward equalization (FFE) and decision feedback equalization (DFE) via numerous delay taps, multipliers, and adders. ADC-DSP based receivers benefit from the ADC being open loop, having digital pipelining, many equalization taps, and other design flexibility, at the cost of consuming more power than analog-based receivers. Embodiments are described herein for performing dynamic voltage scaling (DVS) for asynchronous ADCs to reduce overall power consumption for a system that may reap the benefits of ADC-DSP based receivers.

Methods and systems are described herein for dynamic voltage scaling of an asynchronous ADC that is based on a measurable error performance without sacrificing the reliability and performance of the ADC itself. Specifically, asynchronous ADCs generate a done signal DONE that indicates completion of the conversion of the analog input signal to an analog output signal. Rather than performing error measurements directly on this done signal DONE, which may take an enormous number of samples to accurately measure error performances on the order of 1E-6, embodiments described herein generate a delayed version of the done signal DONE'. The delayed done signal DONE' creates a quantifiable number of errors to enable an accurate error measurement for a dynamic voltage scaling system as described below. The amount of delay applied to the done signal DONE is based on cumulative distribution functions (CDFs) determined during a startup algorithm for varying amount of delay values that, when extrapolated, ensure ADC performance within a target threshold.

Figure 3:
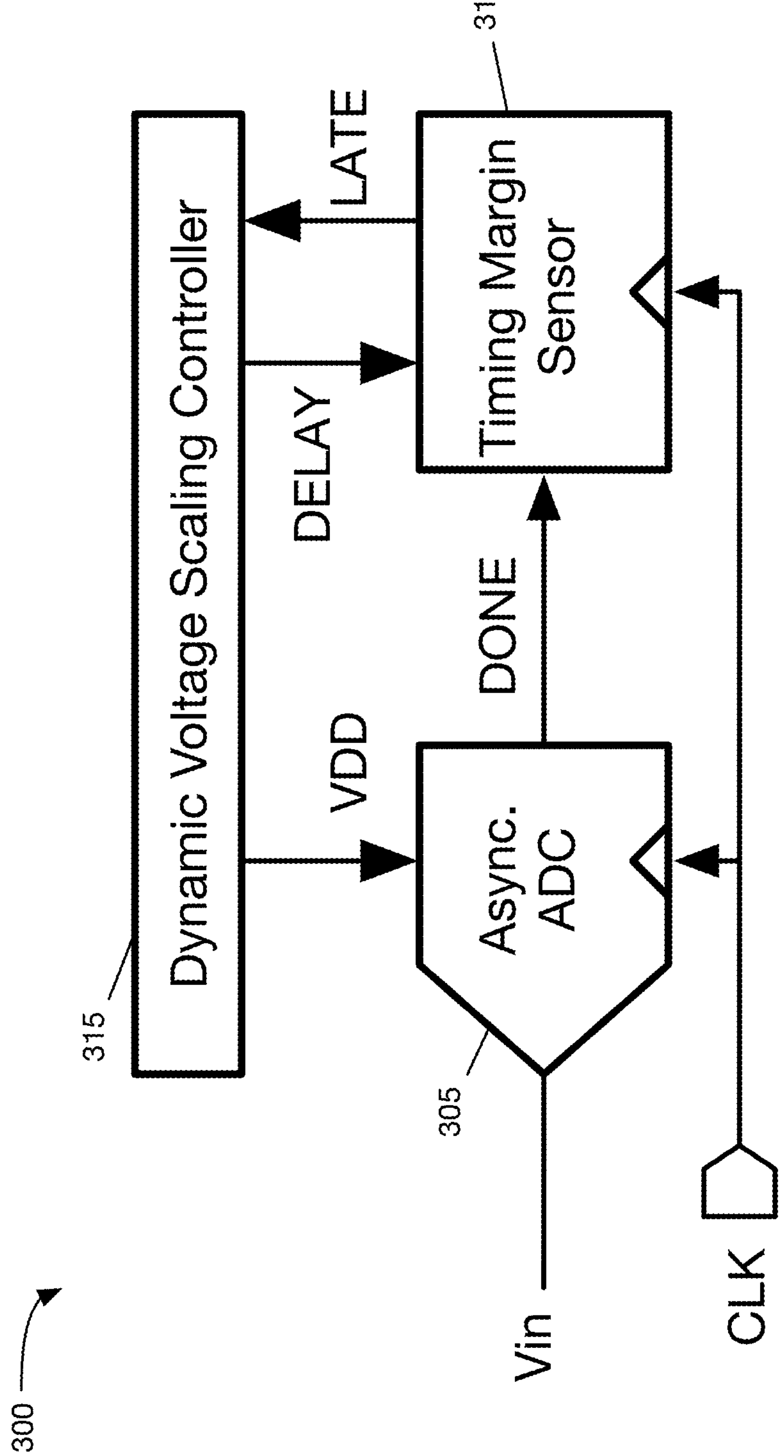
FIG. 3 is a block diagram of a system for performing dynamic voltage scaling (DVS) for an asynchronous ADC, in accordance with some embodiments.

FIG. 3 is a block diagram of an apparatus 300, in accordance with some embodiments. As shown, the apparatus 300 includes a first asynchronous ADC 305 configured to receive an analog input signal and to convert the analog input signal to a digital output signal. The asynchronous ADC is configured to initiate the conversion according to a first clock cycle of clock signal CLK and to output a done signal 'DONE' upon completion of the conversion. The first asynchronous ADC 305 is configured with a supply voltage VDD high enough that the done signal is asserted prior to a next clock cycle of CLK with a predetermined probability ($P_{target}$).

Figure 4:
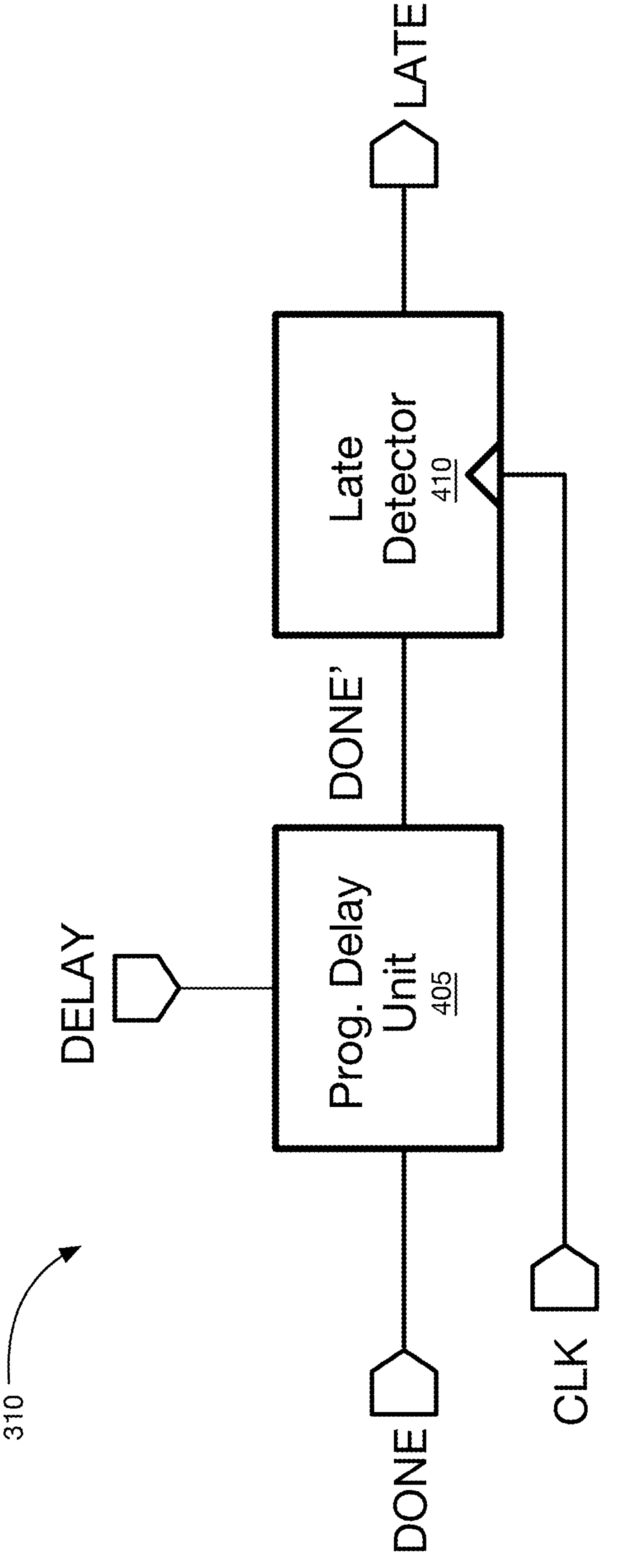
FIG. 4 is a block diagram of a timing margin sensor, in accordance with some embodiments.

The apparatus further includes a timing margin sensor 310. FIG. 4 is a block diagram of the timing margin sensor 310, in accordance with some embodiments. As shown, the timing margin sensor 310 includes a programmable delay unit 405 configured to generate a delayed done signal DONE' having a reduced timing margin. The timing margin sensor further includes a late detector 410 configured to sample the delayed done signal DONE' and to generate an output LATE that indicates whether DONE' was asserted or de-asserted upon being sampled.

The apparatus 300 includes a dynamic voltage scaling controller 315 configured to measure an error rate of the delayed done signal according to the next clock cycle, and to adjust the supply voltage provided to the first asynchronous ADC 305 responsive to the measured error rate $P_0$ deviating from a known error rate by a predetermined threshold ε. In some embodiments, the dynamic voltage scaling controller is configured to increase the supply voltage responsive to the measured error rate increasing above the known error rate by the predetermined threshold. Such an adjustment will increase the timing margin for the conversion of the analog input signal to complete. In some embodiments, the supply voltage is decreased responsive to the measured error rate decreasing below the known error rate by the predetermined threshold. Such an adjustment will reduce the available timing margin to reduce overall power consumption.

In some embodiments, the asynchronous ADC may be a SAR ADC. In some embodiments, multiple asynchronous ADCs may be operating according to a common supply voltage. In such embodiments, the dynamic voltage scaling controller 315 may be configured to measure performance of each ADC and select the worse-case ADC to use for dynamic voltage scaling.

In some embodiments, the analog input signal is a PAM-X signal, wherein X is an integer greater than or equal to two. In some embodiments, the PAM-X signal is a PAM-3 signal. In some embodiments, the PAM-3 signal is a universal serial bus (USB) data signal. In some embodiments, the PAM-X signal is a PAM-4 signal. In some embodiments, the PAM-4 signal is a peripheral component interface express (PCIe) generation 7 data signal.

Figure 5:
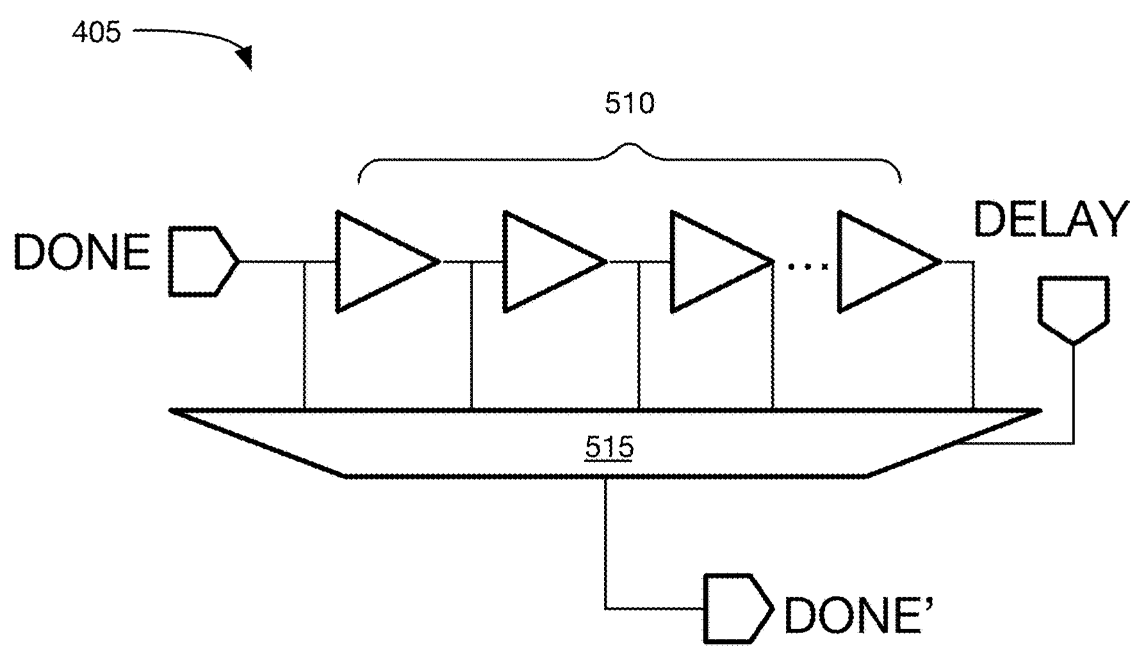
FIG. 5 is a block diagram of a programmable delay unit, in accordance with some embodiments.

FIG. 5 is a block diagram of a programmable delay unit 405, in accordance with some embodiments. As shown, the programmable delay unit 405 includes a buffer chain 510 configured to receive the done signal at an input and to generate delayed versions of the done signal having differing amounts of delay on a plurality of output taps of the buffer chain 510. The programmable delay unit 405 further includes a multiplexer 515 configured to select one of the output taps of the buffer chain 510 as the delayed done signal having the reduced timing margin according to a delay control signal DELAY. The selected output tap may have a reduced timing margin associated with an extrapolation of the predetermined probability that the done signal is asserted prior to the next clock cycle. The reduced timing margin and the corresponding output tap may be determined as part of a startup procedure, for example the startup procedure shown in FIG. 10. The implementation of programmable delay unit 405 shown in FIG. 5 is one non-limiting example, as other structures for applying a configurable delay to an input signal may be used as well.

Figure 6:
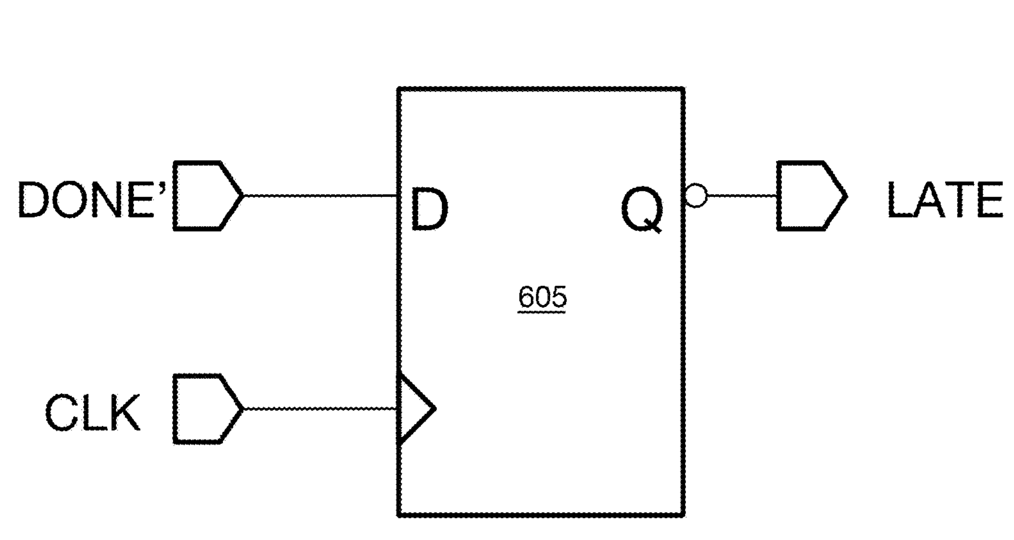
FIG. 6 is a block diagram of a late detector, in accordance with some embodiments.

FIG. 6 illustrates a late detector 410 as including a D flip-flop 605. As shown, the D flip-flop 605 is configured to receive the delayed done signal DONE' and to sample the delayed done signal DONE' according to the same clock signal CLK used to initiate the conversion of the asynchronous ADC. The output of the late detector will indicate whether the delayed done signal DONE' has toggled or not. The implementation of FIG. 6 should not be considered limiting as any one of a variety of early-late detection circuits may be used.

Figure 7:
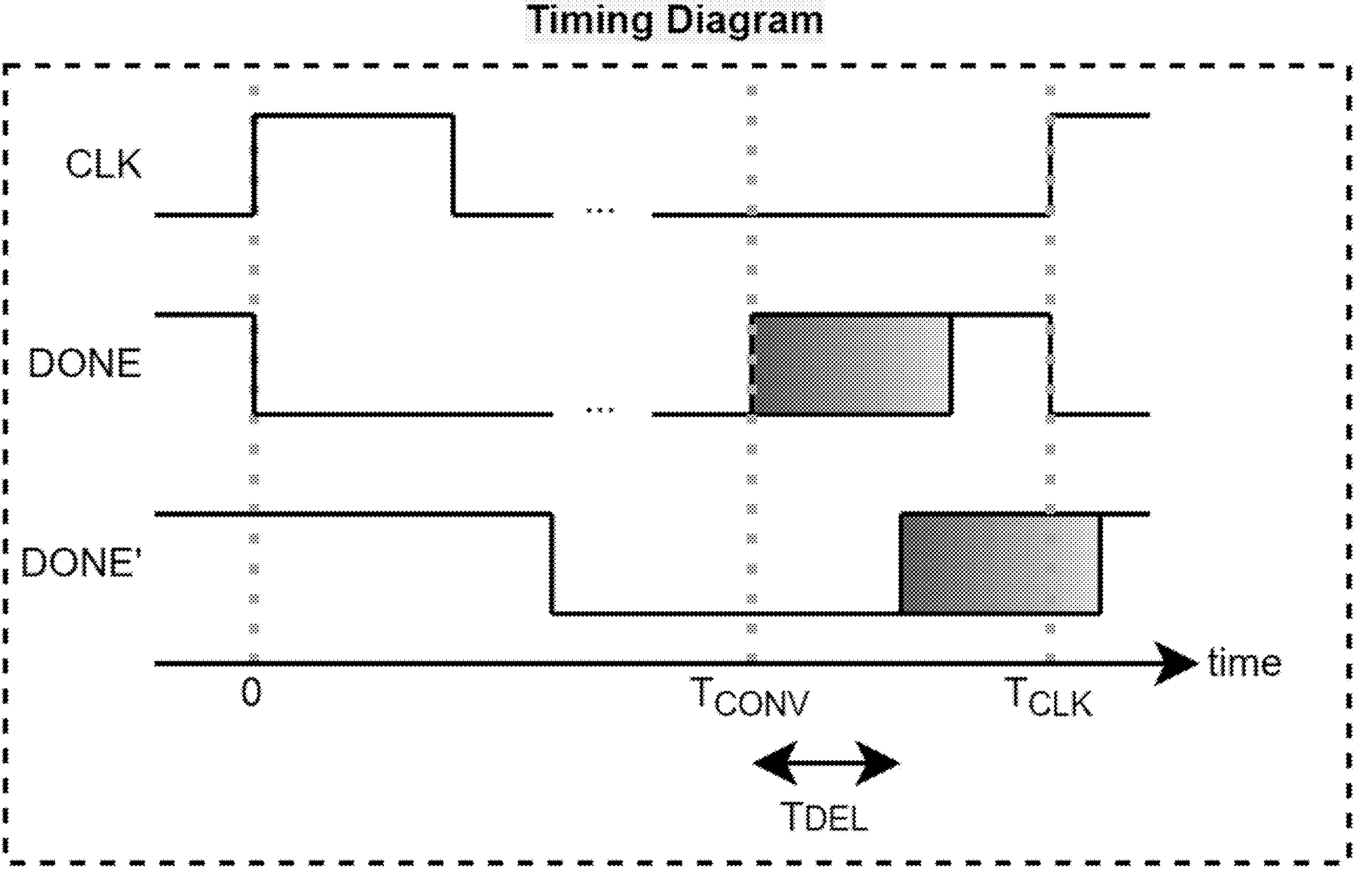
FIG. 7 is a timing diagram illustrating the delayed done signal having a reduced timing margin with respect to the done signal generated by the asynchronous ADC.

FIG. 7 illustrates a timing diagram of the relationship between the done signal DONE generated by the asynchronous ADC 305 and the delayed done signal DONE' generated by the programmable delay unit 405. As shown, initiation of the conversion of the digital input signal to the digital output signal is initiated by the clock signal CLK, and the done signal DONE is de-asserted, as illustrated by a falling edge. Upon completion of the conversion by the asynchronous ADC 305, the DONE signal is asserted, as illustrated by a rising edge. The time for the asynchronous ADC 305 to complete the conversion may be referred to herein as the conversion time Tconv. In some embodiments, the conversion time Tconv may be data dependent, as indicated by the shaded area. The delayed done signal DONE' is a time-shifted version of the done signal DONE. The delayed done signal DONE' similarly has a data-dependent conversion time Tconv which is sampled according to a next clock cycle of clock signal CLK. As shown in FIG. 7, the sample time of the delayed done signal DONE' falls within the conversion region of the delayed done signal DONE'. The delayed done signal DONE' will have a higher measured error rate compared to the actual performance, i.e., the done signal DONE, of the asynchronous ADC 305. The higher error rate allows the dynamic voltage scaling controller 315 to make error rate measurements of the delayed done signal DONE' rather quickly, and use of the delayed done signal DONE' for the measurements does not compromise the performance of the ADC itself in terms of error performance.

Figure 8:
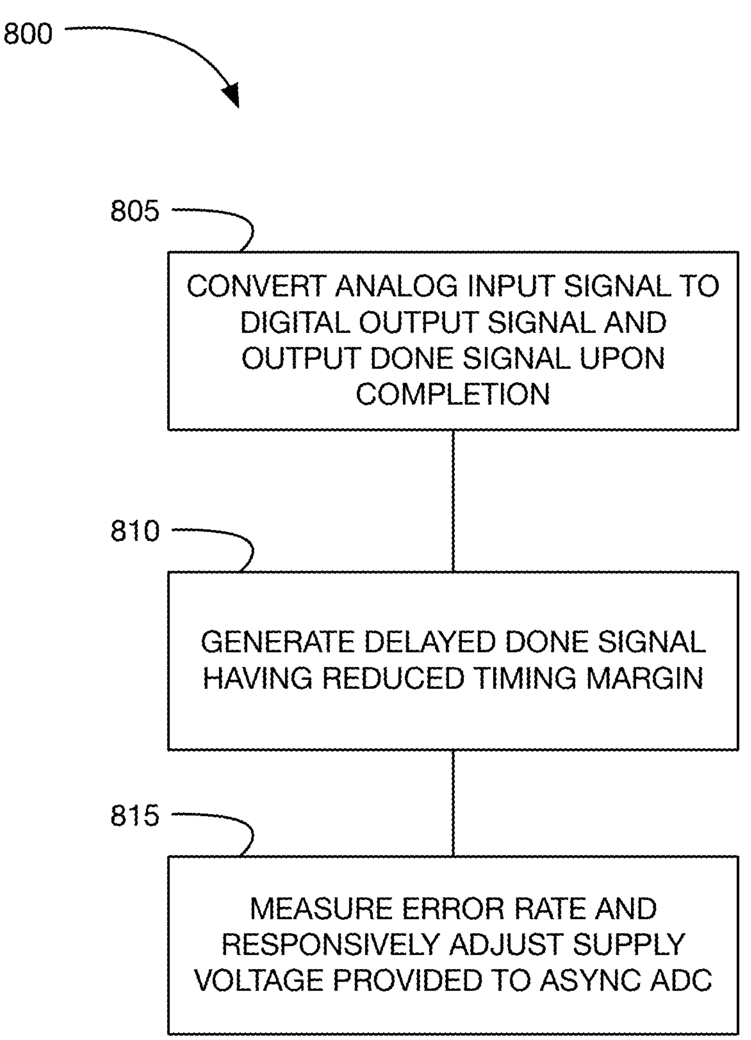
FIG. 8 is a flowchart of a method 800, in accordance with some embodiments.

FIG. 8 is a flowchart of a method 800, in accordance with some embodiments. As shown, the method 800 includes converting 805, using an asynchronous ADC, an analog input signal to a digital output signal according to a first clock cycle, and outputting a done signal upon completion of the conversion, the asynchronous ADC configured with a supply voltage large enough that the done signal is asserted prior to a next clock cycle with predetermined probability. The method further includes generation 810, using a timing margin sensor comprising a programmable delay unit, a delayed done signal having a reduced timing margin. The method further includes measuring 815, using a dynamic voltage scaling controller, an error rate of the delayed done signal according to the next clock cycle, and adjusting the supply voltage provided to the asynchronous ADC responsive to the measured error rate deviating from a known error rate by a predetermined threshold.

Figure 9:
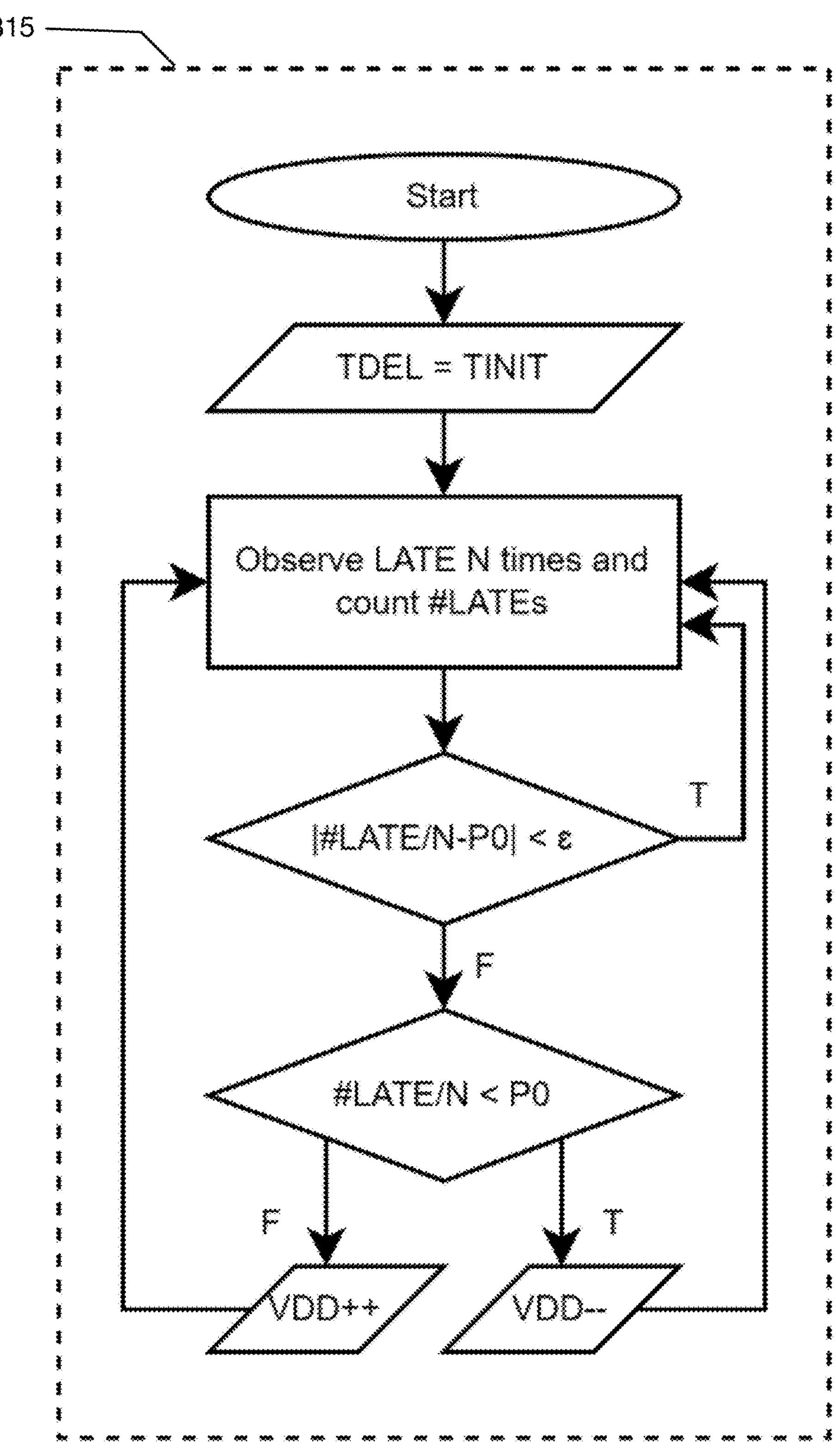
FIG. 9 is a flowchart for measuring error rate of the delayed done signal and updating the supply voltage of the ADC, in accordance with some embodiments.

FIG. 9 is a flowchart of a runtime dynamic voltage scaling procedure, e.g., performed during step 815 of FIG. 8. As shown in FIG. 9, the programmable delay $T_{DEL}$ of the delayed done signal DONE' is configured with an initial value $T_{INIT}$. The value $T_{INIT}$ may be found during a startup procedure, described in more detail below. The dynamic voltage scaling controller 315 observes the samples of the delayed done signal DONE' output by late detector N times and counts how many of the samples are LATE samples. The measured error rate of the delayed done signal DONE' thus corresponds to the number of LATE samples divided by the N total samples generated by the late detector. The runtime procedure may include a hysteresis step to prevent voltage supply toggling. The measured error rate #LATE/N is compared to a known error rate $P_0$ and if the measured error rate is within a predetermined threshold $\varepsilon$, the procedure reverts to the previous step of measuring the error rate again. In some embodiments, the measurement of the error rate may be delayed, i.e., the error rate is checked intermittently during runtime rather than constantly. If the measured error rate deviates from the known error rate $P_0$ by $\varepsilon$, then the supply voltage is updated. If the measured error rate is less than the known error rate $P_0$, then the asynchronous ADC has a large amount of available timing margin and the supply voltage is decreased to reduce the available timing margin while reducing power consumption. Conversely, if the measured error rate is larger than the known error rate $P_0$, then the asynchronous ADC does not have enough timing margin for reliable operation and consequently the supply voltage is increased to reduce the conversion time of the ADC. After the supply voltage is adjusted, the procedure repeats and performs a subsequent measurement of the error rate of the delayed done signal DONE'.

Figure 10:
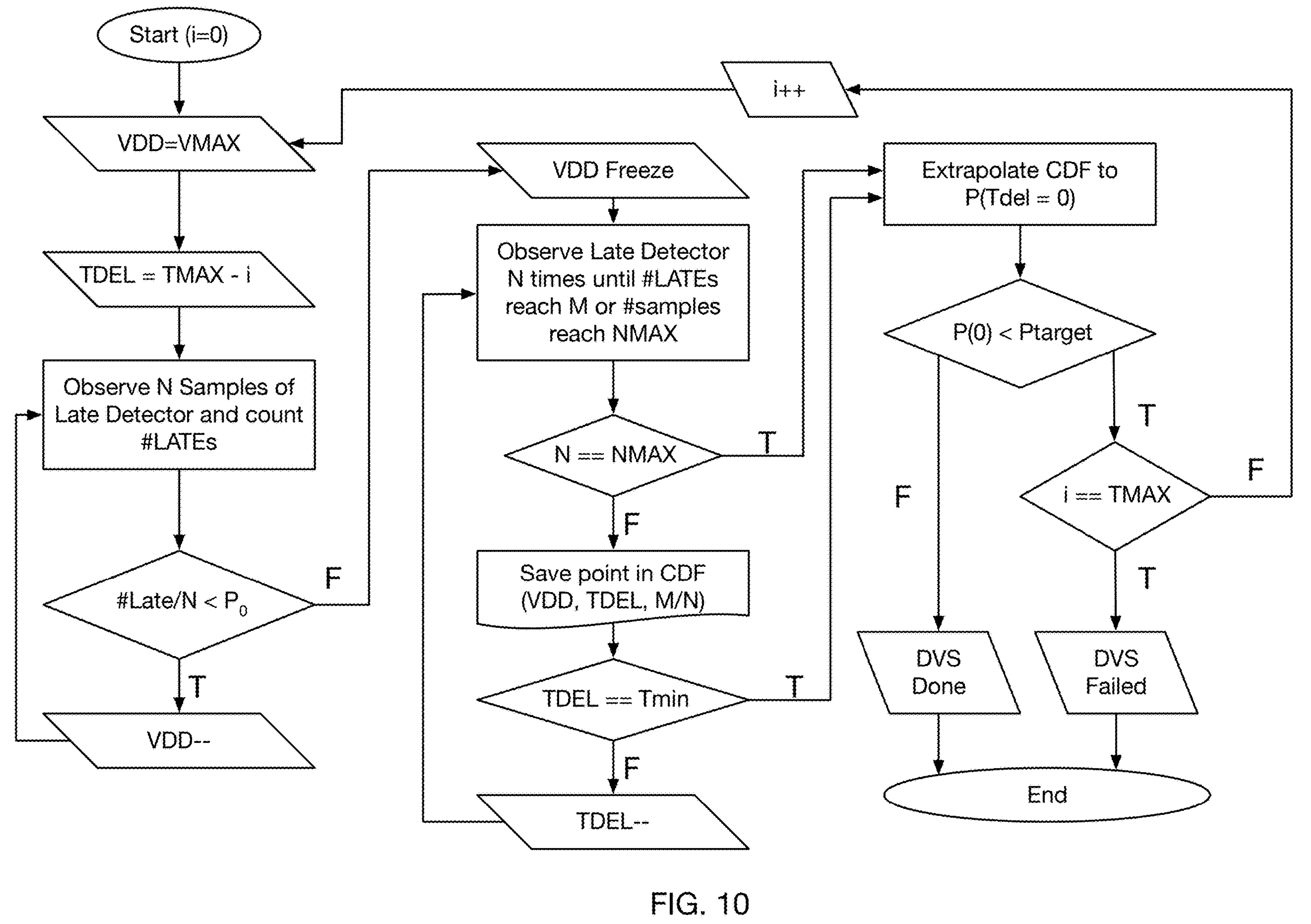
FIG. 10 is a flowchart for a startup algorithm to determine initial supply voltage and reduced timing margin settings, in accordance with some embodiments.

FIG. 10 is a flowchart of a startup procedure used to find the initial supply voltage VDD and the reduced timing margin of the done signal DONE, i.e., the programmable delay applied to DONE to obtain the delayed done signal DONE'. The startup procedure initializes the supply voltage to be at a maximum supply and a maximum delay applied to the done signal DONE to generate the delayed done signal DONE'. In such conditions, it may be appreciated that the error rate of the asynchronous ADC will be at a minimum. The goal of the startup procedure of FIG. 10 is to gradually increase the allotted timing margin, thus reducing the supply voltage until the extrapolated performance of the ADC exceeds the target threshold $P_{target}$.

The startup procedure in FIG. 10 can be analyzed as performing three functions, each function being performed by a respective column. The first column finds a VDD for a particular starting timing margin ($T_{DEL}$ value). Once the VDD is found, the value of VDD is fixed, and the center column measures the cumulative distribution function (CDF) for the fixed value of VDD. The right-hand column extrapolates the CDF for the fixed VDD to find an extrapolated value of the error performance of the asynchronous ADC, i.e., TDEL=0, and compares the extrapolated error rate of the ADC to a target error performance $P_{target}$. The first time running through the loop with the initialized settings will yield a minimum extrapolated error performance far below the target performance $P_{target}$. The algorithm gradually increases the initial timing margin (by reducing TDEL) which will gradually increase the extrapolated error rate of the asynchronous ADC until the extrapolated performance exceeds the target error performance $P_{target}$.

A more detailed explanation of the startup procedure in FIG. 10 is given below. The supply voltage VDD is initialized to VMAX and the amount of delay TDEL applied to the done signal DONE is maxed TMAX. The dynamic voltage scaling controller 315 accumulates N samples of the delayed done signal DONE' using the late detector 410, and divides the #LATE samples during that interval by N, and compares the result to the known probability $P_0$, similar to the runtime algorithm. If the measured error rate for TDEL=TMAX is less than the known probability $P_0$, then the supply voltage VDD is decremented and the error measurement process is repeated. The error measurement process is repeated until the measured error rate exceeds the known probability $P_0$, after which the supply voltage VDD is fixed.

In the center column, the dynamic voltage scaling controller 315 observes N samples of the delayed done signal DONE' until M LATE samples are detected. The procedure calculates an error rate M/N for the current value of TDEL, which is saved in a CDF for the fixed supply voltage VDD as a data point (VDD, TDEL, M/N). The programmable delay TDEL is reduced and the process repeats. The center column generates CDF data points for the fixed VDD over a span of TDEL values. The center column includes a breakout from this loop if the error rate becomes too low to measure, i.e., samples of the late detector 310 are observed NMAX times before reaching M late samples. The center column has accumulated a collection of CDF data points, and the startup procedure moves to the right-hand column for extrapolating the collection of CDF data points to TDEL=0, i.e., the actual error performance of the ADC. If the extrapolated error performance P(0) is less than the target error performance $P_{target}$, then the initial timing margin is increased by reducing the initial TDEL value and a new supply voltage VDD is found in the left-hand column and a new CDF is generated. As mentioned above, the loop of FIG. 10 repeats until the extrapolated error performance of the ADC becomes worse than the target error performance $P_{target}$, and thus the dynamic voltage scaling controller 315 has relaxed the initial operating conditions of the ADC until the ADC is operating at a desired target error rate. The starting TDEL value and the fixed VDD associated with the starting TDEL may be used as initial values for the system during runtime.

What is claimed is:

1. An apparatus comprising:

A first asynchronous ADC configured to receive an analog input signal and to convert the analog input signal to a digital output signal, the asynchronous ADC configured to initiate the conversion according to a first clock cycle and to output a done signal upon completion of the conversion, the first asynchronous ADC configured with a supply voltage high enough that the done signal is asserted prior to a next clock cycle with a predetermined probability;

a timing margin sensor comprising a programmable delay unit configured to generate a delayed done signal having a reduced timing margin; and a dynamic voltage scaling controller configured to measure an error rate of the delayed done signal according to the next clock cycle, and to adjust the supply voltage provided to the first asynchronous ADC responsive to the measured error rate deviating from a known error rate by a predetermined threshold.

2. The apparatus of claim 1, wherein the dynamic voltage scaling controller is configured to increase the supply voltage responsive to the measured error rate increasing above the target error rate by the predetermined threshold.

3. The apparatus of claim 1, wherein the dynamic voltage scaling controller is configured to decrease the supply voltage responsive to the measured error rate decreasing below the target error rate by the predetermined threshold.

4. The apparatus of claim 1, wherein the programmable delay unit comprises a buffer chain configured to receive the done signal at an input and to generate delayed versions of the done signal having differing amounts of delay on a plurality of output taps, the programmable delay unit further comprising a multiplexer configured to select one of the output taps as the delayed done signal having the reduced timing margin according to a delay control signal.

5. The apparatus of claim 1, wherein the dynamic voltage scaling controller is configured to determine the reduced timing margin and an initial supply voltage setting using a startup procedure, the dynamic voltage scaling controller configured to:

initialize the supply voltage to a maximum supply voltage and initialize an amount of delay applied to the done signal to a maximum amount via a delay setting;

incrementally reduce the amount of delay applied to the done signal via the delay setting and to responsively, for each delay setting: determine a corresponding fixed supply voltage associated with the known error rate, and determine a respective cumulative distribution function (CDF) for the delay setting;

determine the delay setting at which an extrapolation of the error performance for the done signal exceeds the predetermined probability that the done signal is asserted prior to a next clock cycle; and output the delay setting and the corresponding fixed supply voltage as the reduced timing margin and the initial supply voltage, respectively.

6. The apparatus of claim 1, wherein the asynchronous ADC is a successive approximation (SAR) register.

7. The apparatus of claim 1, wherein the analog input signal is a PAM-X signal, wherein X is an integer greater than or equal to two.

8. The apparatus of claim 7, wherein the PAM-X signal is a PAM-3 universal serial bus (USB) data signal.

9. The apparatus of claim 7, wherein the PAM-X signal is a PAM-4 peripheral component interface express (PCIe) generation 7 data signal.

10. The apparatus of claim 1, further comprising a second asynchronous ADC connected to the supply voltage, the timing margin sensor is further configured to generate a second delayed done signal associated with the second asynchronous ADC, the dynamic voltage scaling controller is configured to measure the error rate of the second delayed done signal, and wherein the dynamic voltage scaling controller adjusts the supply voltage based on which of the first and second asynchronous ADCs has a worse measured error rate.

11. A method comprising:

converting, using a first asynchronous ADC, an analog input signal to a digital output signal according to a first clock cycle, and outputting a done signal upon completion of the conversion, the first asynchronous ADC configured with a supply voltage large enough that the done signal is asserted prior to a next clock cycle with predetermined probability;

generating, using a timing margin sensor comprising a programmable delay unit, a delayed done signal having a reduced timing margin; and measuring, using a dynamic voltage scaling controller, an error rate of the delayed done signal according to the next clock cycle, and adjusting the supply voltage provided to the first asynchronous ADC responsive to the measured error rate deviating from a target error rate by a predetermined threshold.

12. The method of claim 11, wherein the supply voltage is increased responsive to the measured error rate increasing above the target error rate by the predetermined threshold.

13. The method of claim 11, wherein the supply voltage is decreased responsive to the measured error rate decreasing below the target error rate by the predetermined threshold.

14. The method of claim 11, wherein generating the delayed done signal comprises providing the done signal to a buffer chain having a plurality of output taps, and selecting one of the output taps as the delayed done signal having the reduced timing margin according to a delay control signal.

15. The method of claim 11, further comprising determining the reduced timing margin and an initial supply voltage setting using a startup procedure, the startup procedure comprising:

initializing the supply voltage to a maximum supply voltage and initializing an amount of delay applied to the done signal to a maximum amount via a delay setting;

incrementally reducing the amount of delay applied to the done signal via the delay setting and to responsively, for each delay setting: determining a corresponding fixed supply voltage associated with the known error rate, and determining a respective cumulative distribution function (CDF) for the delay setting;

determining the delay setting at which an extrapolation of the error performance for the done signal exceeds the predetermined probability that the done signal is asserted prior to a next clock cycle; and outputting the delay setting and the corresponding fixed supply voltage as the reduced timing margin and the initial supply voltage, respectively.

16. The method of claim 15, wherein the startup procedure is repeated for a second asynchronous ADC, and the determined delay setting is selected based on which of the first and second asynchronous ADC has a larger delay setting associated with a larger amount of delay.

17. The method of claim 11, wherein the analog input signal is a PAM-X signal, wherein X is an integer greater than or equal to two.

18. The method of claim 17, wherein the PAM-X signal is a PAM-3 universal serial bus (USB) data signal.

19. The method of claim 17, wherein the PAM-X signal is a PAM-4 peripheral component interface express (PCIe) generation 7 data signal.

20. The method of claim 11, wherein measuring the error rate of the delayed done signal comprises sampling the delayed done signal for N conversions, and determining how many late samples occurred during the N conversions.

* * * * *